(12) United States Patent
Pu et al.

(10) Patent No.: US 11,257,741 B2
(45) Date of Patent: Feb. 22, 2022

(54) SEMICONDUCTOR PACKAGE

(71) Applicant: Samsung Electronics Co., Ltd., Suwon-si (KR)

(72) Inventors: Bo Pu, Suwon-si (KR); Jun So Pak, Suwon-si (KR); Sung Wook Moon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 55 days.

(21) Appl. No.: 16/692,333

(22) Filed: Nov. 22, 2019

(65) Prior Publication Data

US 2020/0381347 A1     Dec. 3, 2020

(30) Foreign Application Priority Data

May 28, 2019  (KR) .......................... 10-2019-0062277

(51) Int. Cl.
*H01L 23/498*  (2006.01)
*H01L 25/065*  (2006.01)
*H01L 23/00*  (2006.01)

(52) U.S. Cl.
CPC .. *H01L 23/49816* (2013.01); *H01L 23/49827* (2013.01); *H01L 24/13* (2013.01); *H01L 25/0657* (2013.01); *H01L 2225/06541* (2013.01)

(58) Field of Classification Search
CPC ............. H01L 23/49827; H01L 23/481; H01L 25/0657; H01L 23/5286
See application file for complete search history.

(56) References Cited

U.S. PATENT DOCUMENTS

| | | | |
|---|---|---|---|
| 6,599,778 B2 | 7/2003 | Pogge et al. | |
| 8,227,902 B2 | 7/2012 | Kuo | |
| 8,546,953 B2 | 10/2013 | Horng et al. | |
| 8,587,121 B2 | 11/2013 | Koester et al. | |
| 8,604,594 B2 | 12/2013 | Kuo | |
| 8,664,540 B2 | 3/2014 | Lu et al. | |
| 9,123,730 B2 | 9/2015 | Kuo et al. | |
| 9,167,694 B2 | 10/2015 | Sundaram | |
| 9,607,967 B1 | 3/2017 | Shih | |
| 10,211,123 B2* | 2/2019 | Son ...................... H01L 23/535 |
| 2008/0277778 A1* | 11/2008 | Furman ................ H01L 21/768 |
| | | | 257/713 |
| 2016/0343613 A1 | 11/2016 | Uzoh | |

\* cited by examiner

*Primary Examiner* — Dale E Page
*Assistant Examiner* — Wilner Jean Baptiste
(74) *Attorney, Agent, or Firm* — Harness, Dickey & Pierce, P.L.C

(57) ABSTRACT

A semiconductor package may comprise: a first passivation layer forming an electrical connection with one or more first bumps; a substrate layer including a second passivation layer and a silicon layer; a back-end-of-line (BEOL) layer formed on the substrate layer; and a third passivation layer formed on the BEOL layer forming an electrical connection with one or more second bumps, wherein the substrate layer includes a first signal TSV (Through Silicon Via) which transmits a first signal between the BEOL layer and a first lower pad, a second signal TSV which transmits a second signal between the BEOL layer and a second lower pad, and a ground TSV which is disposed between the first signal TSV and the second signal TSV and formed so that one end thereof is connected to the BEOL layer and the other end thereof floats.

18 Claims, 12 Drawing Sheets

SEMICONDUCTOR PACKAGE

This U.S. non-provisional application claims the benefit of priority under 35 U.S.C. § 119 from Korean Patent Application No. 10-2019-0062277, filed on May 28, 2019 in the Korean Intellectual Property Office (KIPO), the entire disclosure of which is hereby incorporated herein by reference.

BACKGROUND

1. Field

Various example embodiments of the inventive concepts relate to a semiconductor package.

2. Description of the Related Art

With the rapid development of an electronic industry and demands of users, semiconductor packages used in electronic devices require a miniaturization, a high performance, a low power consumption, and the like, and a three-dimensional integrated circuit (IC) having the form of three-dimensionally stacked chips has received attention to implement such requirements. In addition, research and development of a semiconductor package including through-silicon via (TSV) for the implementation of three-dimensional IC are continuously performed.

The TSV plays a very important role in more advanced semiconductor chips, semiconductor packages, and semiconductor systems, such as three-dimensional IC, but it has a problem of crosstalk noise. The crosstalk may occur due to unwanted interactions between TSVs or may occur due to unwanted interactions between active elements such as a metal-oxide-semiconductor field-effect transistor (MOSFET) and the TSV. Since the crosstalk increases a noise margin which degrades the signal reliability and increases a bit error rate in signal transmission, a plan for reducing the crosstalk is required.

SUMMARY

Aspects related to various example embodiments of the present inventive concepts provide a semiconductor package capable of reducing a crosstalk occurring between TSVs inside the semiconductor package.

According to some example embodiments of the present inventive concepts, a semiconductor package comprises: a first passivation layer including a first lower pad and a second lower pad, the first lower pad and the second lower pad forming an electrical connection with one or more first bumps, the first passivation layer including a first back metal and a second back metal; a substrate layer including a second passivation layer and a silicon layer, the substrate layer formed on the first passivation layer; a back-end-of-line (BEOL) layer including a plurality of metal layers, the BEOL layer formed on the substrate layer; a third passivation layer formed on the BEOL layer, the third passivation layer including a first upper pad and a second upper pad, the first upper pad and the second upper pad forming an electrical connection with one or more second bumps; and the substrate layer further including a first signal TSV (Through Silicon Via) configured to transmit a first signal between the BEOL layer and the first lower pad through the first back metal, a second signal TSV configured to transmit a second signal between the BEOL layer and the second lower pad through the second back metal, and a ground TSV disposed between the first signal TSV and the second signal TSV, the ground TSV including a first end of the ground TSV connected to the BEOL layer, and a second end of the ground TSV configured to float.

According to some example embodiments of the present inventive concepts, a semiconductor package comprises a first passivation layer including a first lower pad and a second lower pad, the first passivation layer forming an electrical connection with one or more first bumps; a substrate layer formed on the first passivation layer; a back-end-of-line (BEOL) layer formed on the substrate layer; and the substrate layer includes a first signal TSV (Through Silicon Via) configured to transmit a first signal between the first lower pad and the BEOL layer, a second signal TSV configured to transmit a second signal between the second lower pad and the BEOL layer, and at least one ground TSV, the at least one ground TSV not physically connected to the first bump.

According to some example embodiments of the present inventive concepts, a semiconductor package comprises: a package substrate; an interposer bonded on the package substrate through one or more first bumps, the interposer including a first passivation layer, the first passivation layer including a first lower pad and a second lower pad, the first lower pad and the second lower pad forming an electrical connection with the one or more first bumps, the first passivation layer including a first back metal and a second back metal, a back-end-of-line (BEOL) layer including a plurality of metal layers, the BEOL layer formed on a substrate layer, the substrate layer including a second passivation layer and a silicon layer, the substrate layer formed on the first passivation layer, a first signal TSV (Through Silicon Via) configured to transmit a first signal between the BEOL layer and the first lower pad through the first back metal, a second signal TSV configured to transmit a second signal between the BEOL layer and the second lower pad through the second back metal, and a ground TSV disposed between the first signal TSV and the second signal TSV, the ground TSV including a first end and a second end, the first end connected to the BEOL layer, and the second end configured to float, and a third passivation layer formed on the BEOL layer, the third passivation layer including a first upper pad and a second upper pad, the third passivation layer forming an electrical connection with one or more second bumps.

However, aspects of the example embodiments of the present inventive concepts are not restricted to the ones set forth herein. The above and other aspects of the example embodiments will become more apparent to one of ordinary skill in the art to which the example embodiments pertain by referencing the detailed description of the example embodiments of the present inventive concepts given below.

BRIEF DESCRIPTION OF THE DRAWINGS

The above and other aspects and features of the present inventive concepts will become more apparent by describing in detail example embodiments thereof with reference to the attached drawings, in which.

DETAILED DESCRIPTION

Hereinafter, various example embodiments of the present inventive concepts will be described with reference to the attached drawings.

Figure 1:
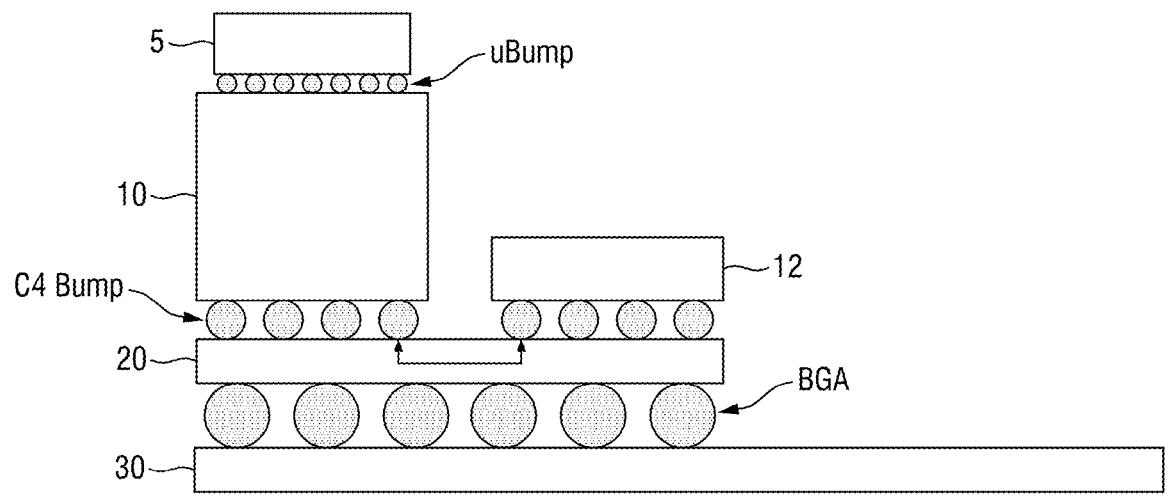
FIG. 1 is a diagram for explaining a semiconductor package according to at least one example embodiment of the present inventive concepts.

FIG. 1 is a diagram for explaining a semiconductor package according to at least one example embodiment of the present inventive concepts.

Referring to FIG. 1, a semiconductor package 1 according to at least one example embodiment of the present inventive concepts may include a first semiconductor chip 5, an interposer 10, a second semiconductor chip 12, and/or a package substrate 20, etc., but is not limited thereto, and may include a greater or lesser number of constituent elements.

The interposer 10 may be bonded on the package substrate 20 through one or more first bumps C4 (e.g., first C4 bumps, etc.), but the example embodiments are not limited thereto.

The first semiconductor chip 5 may be bonded on the interposer 10 through one or more second bumps uBump (e.g., second uBump bumps), but the example embodiments are not limited thereto. In some example embodiments of the present inventive concepts, the first semiconductor chip 5 may include an application specific integrated circuit (ASIC), but the example embodiments are not limited thereto.

As illustrated in FIG. 1, a size of the first bump C4 Bump is greater than a size of the second bump uBump, or in other words, a C4 bump is larger than a uBump, but the example embodiments are not limited thereto.

The second semiconductor chip 12 may be disposed in parallel with the interposer 10 and bonded on the package substrate 20, but the example embodiments are not limited thereto. The second semiconductor chip 12 may also be bonded to the package substrate 20 using one or more of the first C4 bumps, but the example embodiments are not limited thereto.

In the illustrated example embodiment, the interposer 10 may transfer signals between semiconductor chips, such as the first semiconductor chip 5 and the second semiconductor chip 12, etc. For example, the interposer 10 may transfer a signal, which is transmitted from the first semiconductor chip 5, to the second semiconductor chip 12 or may transfer a signal, which is transmitted from the second semiconductor chip 12, to the first semiconductor chip 5, etc.

Figure 2:
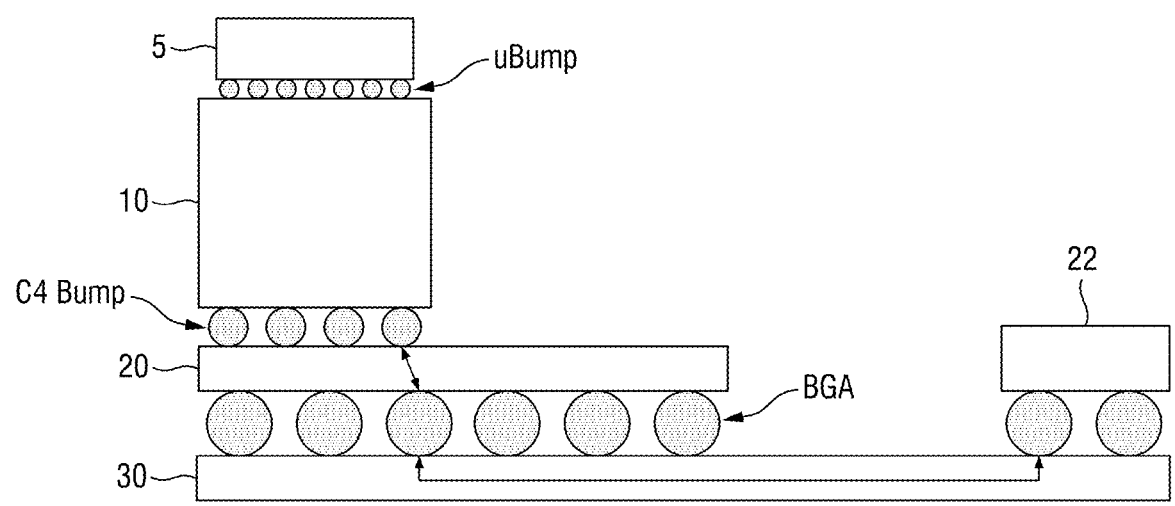
FIG. 2 is a diagram for explaining the semiconductor package according to at least one example embodiment of the present inventive concepts.

FIG. 2 is a diagram for explaining the semiconductor package according to at least one example embodiment of the present inventive concepts.

Referring to FIG. 2, a semiconductor package 2 according to at least one example embodiment of the present inventive concepts may include a first semiconductor chip 5, an interposer 10, a package substrate 20, a third semiconductor chip 22, and/or a printed circuit board 30, etc., but the example embodiments are not limited thereto.

The interposer 10 may be bonded on the package substrate 20 through one or more first C4 bumps, but the example embodiments are not limited thereto.

The first semiconductor chip 5 may be bonded on the interposer 10 through one or more second uBump bumps, but the example embodiments are not limited thereto. In some example embodiments of the present inventive concepts, the first semiconductor chip 5 may include an application specific integrated circuit (ASIC), but the example embodiments are not limited thereto, and the first semiconductor chip may be other semiconductor devices.

As illustrated in FIG. 2, the size of the first bump C4 Bump is greater than the size of the second bump uBump, but the sizes are not limited thereto.

The package substrate 20 may be bonded on the printed circuit board 30 through a ball grid array (BGA), but is not limited thereto. That is, the printed circuit board 30 may be bonded to a lower part of the package substrate 20 through the BGA.

The third semiconductor chip 22 may be disposed in parallel with the package substrate 20 and may be bonded on the printed circuit board 30, but the example embodiments are not limited thereto. The third semiconductor chip 22 may also be bonded to the printed circuit board 30 using the BGA, but the example embodiments are not limited thereto.

According to at least one example embodiment, the interposer 10 may transfer signals between semiconductor devices, such as the first semiconductor chip 5 and the third semiconductor chip 22, etc. That is, the interposer 10 may transfer the signal, which is transmitted from the first semiconductor chip 5, to the third semiconductor chip 22 and/or may transfer the signal, which is transmitted from the third semiconductor chip 22, to the first semiconductor chip 5, etc.

Figure 3:
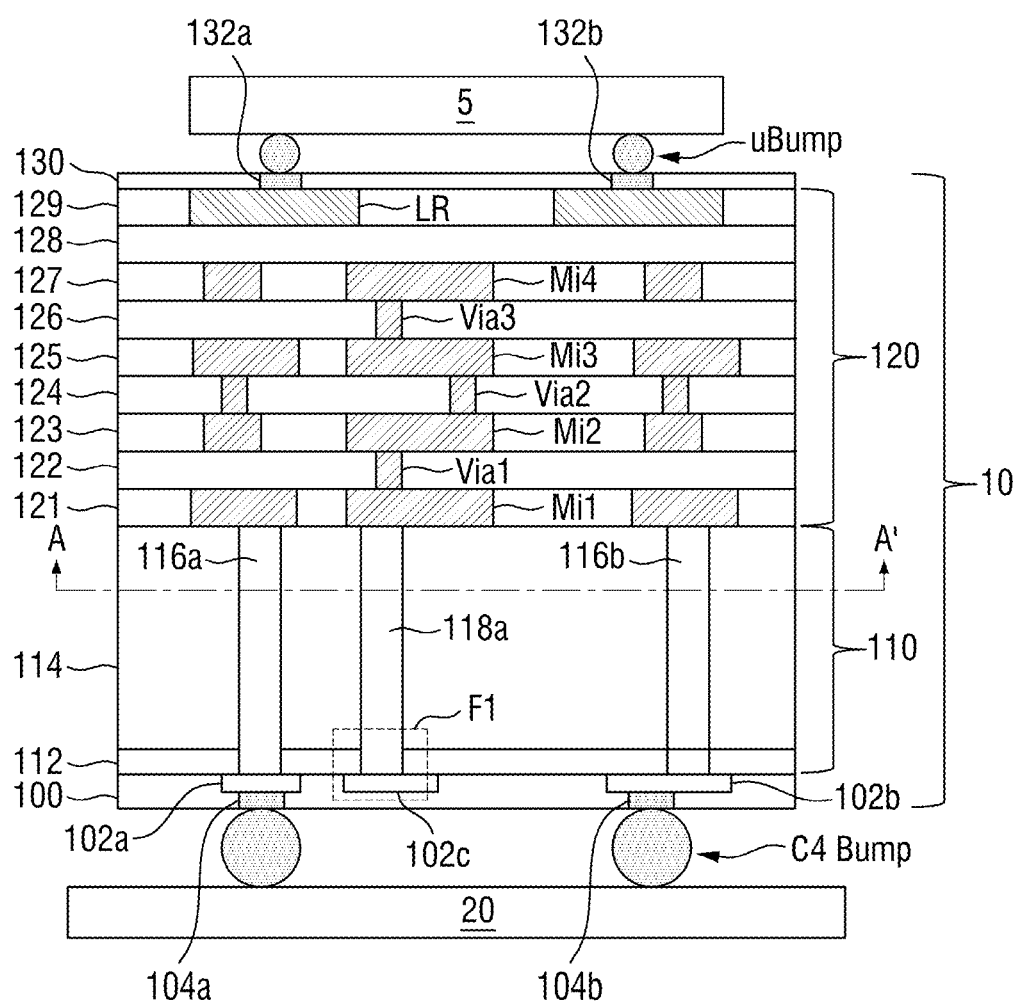
FIG. 3 is a diagram for explaining an interposer according to at least one example embodiment of the present inventive concepts.

FIG. 3 is a diagram for explaining an interposer according to at least one example embodiment of the present inventive concepts.

Referring to FIG. 3, the interposer 10 according to at least one example embodiment of the present inventive concepts may include a first passivation layer 100, a substrate layer 110, a BEOL layer 120 and/or a third passivation layer 130, etc., but is not limited thereto.

The first passivation layer 100 may include at least one lower pad, such as a first lower pad 104a and/or a second lower pad 104b, etc., but is not limited thereto. The first lower pad 104a and the second lower pad 104b may form an electrical connection with one or more first bumps C4, etc. Thus, the interposer 10 is bonded to the package substrate 20 through one or more first bumps (e.g., C4 Bumps), the one or more first bumps (e.g., C4 bumps) forming an electrical connection with the first lower pad 104a and the second lower pad 104b, and the interposer 10 may transmit and/or receive a signal, such as transmit and/or receive a signal to the second semiconductor chip 12 through the lower pads, the first bumps, and the package substrate 20, etc., at the same time.

Meanwhile, the first passivation layer 100 may also include at least one back metal layer connected to the at least one lower pad, such as a first back metal 102a and/or a second back metal 102b, but is not limited thereto. The first back metal 102a and the second back metal 102b may form electrical connections with the first lower pad 104a and the second lower pad 104b, respectively.

Additionally, the first passivation layer 100 may also include other elements, such as a third back metal 102c between the first back metal 102a and the second back metal 102b, etc. Unlike the first back metal 102a and the second back metal 102b which form electrical connections with the first bump C4 Bump, the third back metal 102c does not form an electrical connection with the first bump C4 Bump, and may instead "float."

According to at least one example embodiment, although the first passivation layer 100 is illustrated to include two lower pads and three back metals, one of ordinary skill in the art would understand that the number of lower pads and back metals may vary.

A substrate layer 110 is formed on the first passivation layer 100. The substrate layer 110 may include a second passivation layer 112, and/or a silicon layer 114, etc., but the example embodiments are not limited thereto, and other constituent elements may be included in the substrate layer 110. Additionally, the substrate layer 110 may be formed on the first passivation layer 100. The silicon layer 114 may include Si.

A BEOL layer 120 is formed on the substrate layer 110. The BEOL layer 120 may include a plurality of metal layers 121 to 129, but is not limited thereto. For example, a plurality of metal layers (e.g., metal layers 121 to 129) may include a first metal layer 121, a first via layer 122 formed on the first metal layer 121, a second metal layer 123 formed on the first via layer 122, a second via layer 124 formed on the second metal layer 123, a third metal layer 125 formed on the second via layer 124, a third via layer 126 formed on the third metal layer 125, a fourth metal layer 127 formed on the third via layer 126, a fourth via layer 128 formed on the fourth metal layer 127, and an LR layer 129 formed on the fourth via layer 128, etc.

According to at least one example embodiment, the one or more metal layers may include one or more respective metals and/or one or more vias, for example, first metal layer to the fourth metal layer 121, 123, 125 and 127 may include first to fourth metals Mi1 to Mi4, respectively, and the first via layer to the third via layer 122, 124 and 126 may include first to third vias Via1 to Via3, respectively. According to other example embodiments, for example, the fourth via layer 128 may also include a fourth via 4 (not shown), etc., if desired. Further, the LR layer 129 may include a first LR and a second LR, but is not limited thereto.

In some example embodiments of the present inventive concepts, the first to fourth metals Mi1 to Mi4 may include, for example, Cu, etc., but the scope of the example embodiments are not limited thereto. Meanwhile, in some example embodiments of the present inventive concepts, the first LR and the second LR may include Al, etc., but the example embodiments are not limited thereto.

The third passivation layer 130 is formed on the BEOL layer 120. The third passivation layer 130 may include at least one upper pad, such as a first upper pad 132a and a second upper pad 132b, etc. The first upper pad 132a and the second upper pad 132b may form an electrical connection with one or more second bumps uBump, etc. Thus, the interposer 10 is bonded to the first semiconductor chip 5 through one or more second bumps uBump forming an electric connection with the first upper pad 132a and the second upper pad 132b, and may transmit or receive signals between semiconductor chips at the same time.

In at least one example embodiment, the substrate layer 110 may include at least one signal TSV for transmitting signals between a BEOL layer and one or more first bumps, such as first signal TSV 116a and/or a second signal TSV 116b, etc., but the example embodiments are not limited thereto.

For example, the first signal TSV 116a may transmit a first signal between the BEOL layer 120 and the first lower pad 104a through the first back metal 102a. That is, the first signal TSV 116a may transmit the first signal from the BEOL layer 120 to the first lower pad 104a and/or may transfer the first signal received through the first lower pad 104a to the BEOL layer 120, etc.

The second signal TSV 116b may transmit a second signal between the BEOL layer 120 and the second lower pad 104b through the second back metal 102b. That is, the second signal TSV 116b may transmit the second signal from the BEOL layer 120 to the second lower pad 104b and/or may transfer the second signal received through the second lower pad 104b to the BEOL layer 120, etc. However, the example embodiments are not limited thereto, and for example, there may be less than or more than two signal TSVs/lower pads/back metals, etc.

Here, the first signal TSV 116a may correspond to an aggressor signal TSV that causes crosstalk noise, and the second signal TSV 116b may correspond to a victim signal TSV affected by the crosstalk noise caused by the first signal TSV 116a. That is, crosstalk noise occurs by unwanted interactions between the TSVs formed in the substrate layer 110, which may degrade the signal reliability, increase the bit error rate, and/or cause other undesired performance issues of an interposer and connected semiconductor devices, etc.

In order to reduce such crosstalk noise, the substrate layer 110 may further include at least one ground TSV, such as ground TSV 118a. The ground TSV 118a does not function to carry a signal (e.g., the ground TSV is not configured to transmit/receive a signal), but instead functions to reduce the crosstalk noise between the first signal TSV 116a and the second signal TSV 116b.

According to at least one example embodiment, the ground TSV 118a is disposed between the first signal TSV 116a and the second signal TSV 116b, and is formed so that one end thereof is connected to the BEOL layer 120 and the other end thereof floats (e.g., the ground TSV is electrically open, etc.).

Since the ground TSV 118a does not carry a signal, a first bump C4 Bump is not formed at the lower part thereof. In other words, because the ground TSV 118a does not need to have a function for carrying the signal, it is not desired and/or necessary to assign the first bump C4 Bump to the ground TSV 118a. By forming the ground TSV 118a on the substrate 110 without an assignment of and/or connection to the first bump C4 Bump, the ground TSV 118a may have various arrangements with relatively various numbers between the first signal TSV 116a and the second signal TSV 116b, as it will be described below with reference to FIGS. 4 to 8.

In at least one example embodiment, one end of the ground TSV 118a forms an electrical connection with the first metal Mi1 included in the plurality of metal layers 121 to 129 of the BEOL layer 120. Meanwhile, the first passivation layer 110 may further include a third back metal 102c below the ground TSV 118a (e.g., the third back metal 102c is formed such that it is physically connected to one end of the ground TSV 118a). The other end of the ground TSV 118a may form an electrical connection with the third back metal 102c.

In at least one example embodiment, a floating region F1 indicated by the broken lines in FIG. 3 includes the other end of the ground TSV 118a. That is, the floating region F1 indicates that the ground TSV 118a floats. In other words, the ground TSV 118a may be electrically opened (e.g., open circuit). Also, in other words, the ground TSV 118a is not connected to the first bump C4 Bump and/or the package substrate (e.g., package substrate 20).

In other words, the ground TSV 118*a* may be formed to extend from the BEOL layer 120 to an upper surface of the third back metal 102*c*, but is not limited thereto.

The ground TSV 118*a* thus formed may mitigate and/or decrease the crosstalk noise between the first signal TSV 116*a* and the second signal TSV 116*b*.

Subsequently, a horizontal cross section of the substrate layer 110 along the line A-A' will be described.

FIGS. 4 to 8 are diagrams for explaining the horizontal cross section of the interposer according to some example embodiments of the present inventive concepts.

Figure 4:
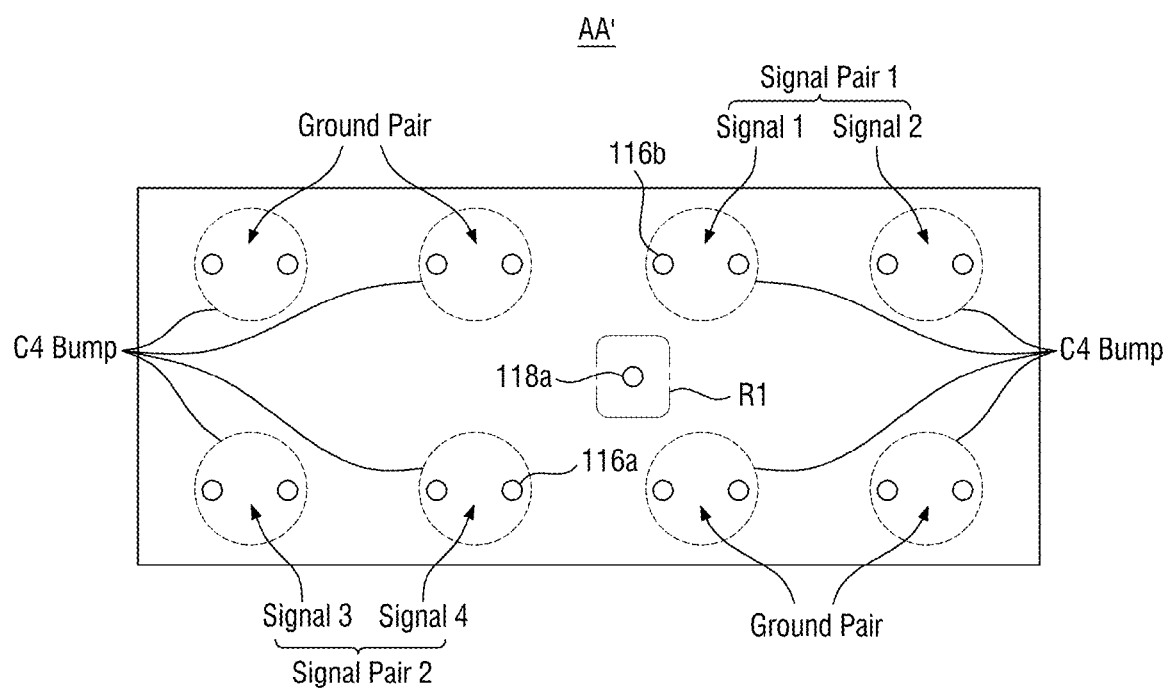
FIGS. 4 to 8 are diagrams for explaining a horizontal cross section of the interposer according to various example embodiments of the present inventive concepts.

Referring to FIG. 4, in at least one example embodiment, a total of sixteen TSVs are illustrated and a single ground TSVs 118*a* formed in a region R1, however the example embodiments are not limited to sixteen TSVs and one ground TSV, and may include a greater or lesser number of TSVs and/or ground TSVs. Sequentially from a left top, two TSVs forming one ground signal are formed on one first bump C4 Bump (e.g., a first C4 bump), and then two TSVs forming the other ground signal is formed on the other first bump C4 Bump (e.g., a second C4 bump). The four TSVs form a ground pair.

Next, at the right top, two TSVs forming a first signal are formed on one first bump C4 Bump (e.g., two TSVs forming a first signal are connected to a first C4 bump), and then two TSVs forming a second signal is formed on the other first bump C4 Bump (e.g., two TSVs forming a second signal are connected to a second C4 bump). The four TSVs form a first signal pair. According to at least one example embodiment, one of the two TSVs forming the first signal may correspond to the second signal TSV 116*b* of FIG. 3.

Next, at the left bottom, two TSVs forming a third signal are formed on one first bump C4 Bump (e.g., two TSVs forming a third signal are connected to a third C4 bump), and then two TSVs forming a fourth signal is formed on the other first bump C4 Bump (e.g., two TSVs forming a fourth signal are connected to a fourth C4 bump). The four TSVs form a second signal pair. According to at least one example embodiment, one of the two TSVs forming the fourth signal may correspond to the first signal TSV 116*a* of FIG. 3.

Next, in the case of a right bottom, since the explanation content is the same as that of the case of the left top, repeated explanation will not be provided.

According to at least one example embodiment, in the horizontal cross section of the substrate layer 110, one ground TSV 118*a* may be disposed in the region R1 between the first signal TSV 116*a* and the second signal TSV 116*b*, but is not limited thereto. This makes it possible to mitigate a crosstalk noise that may occur between the first signal TSV 116*a* and the second signal TSV 116*b*.

Figure 5:
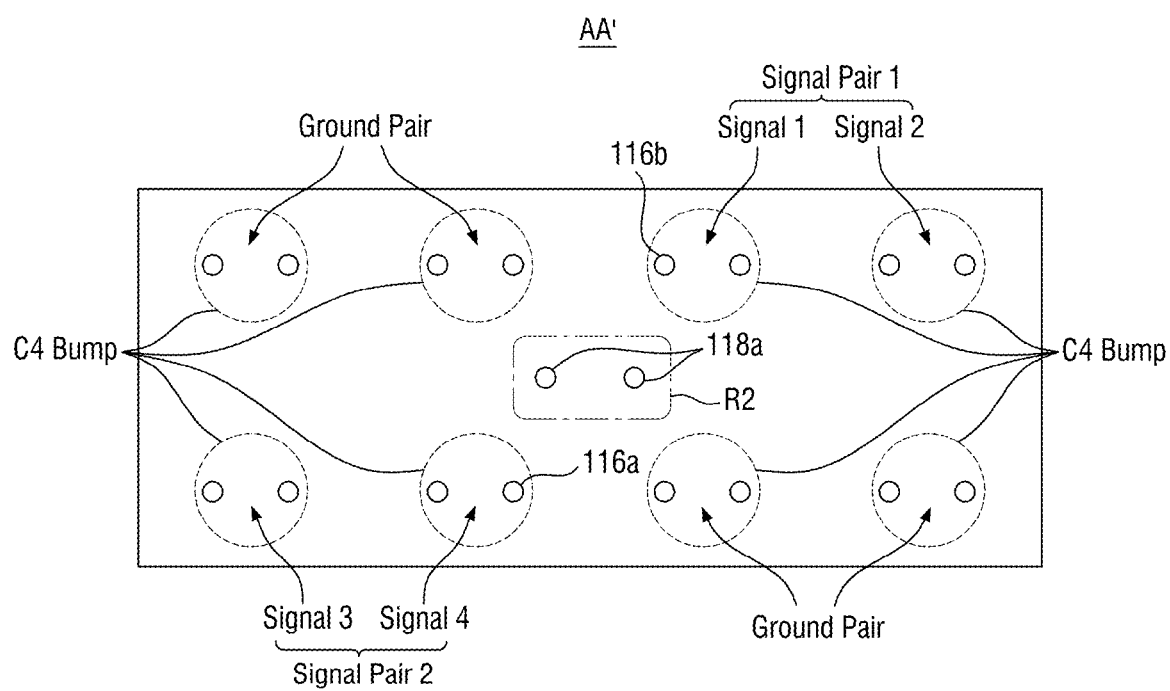

Subsequently, referring to FIG. 5, in at least one example embodiment, a total of sixteen TSVs are illustrated and two ground TSVs 118*a* formed in the region R2, and since the explanation thereof is the same as the explanation related to FIG. 4, the repeated explanation will not be provided here.

According to at least one example embodiment, in the horizontal cross section of the substrate layer 110, two ground TSVs 118*a* may be disposed in the region R2 between the first signal TSV 116*a* and the second signal TSV 116*b*. In particular, two ground TSVs 118*a* may be disposed to be arranged in a horizontal direction. This makes it possible to more effectively mitigate a crosstalk noise that may occur between the first signal TSV 116*a* and the second signal TSV 116*b*.

Figure 6:
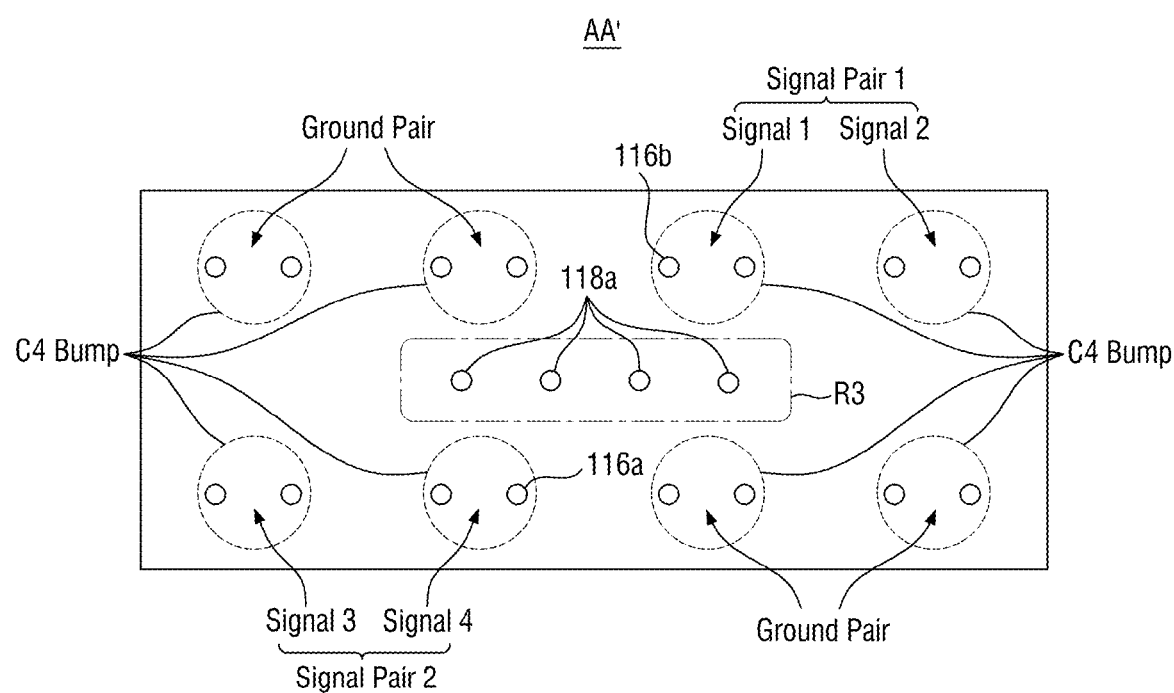

Subsequently, referring to FIG. 6, in at least one example embodiment, a total of sixteen TSVs are illustrated along with four ground TSVs 118*a* formed in the region R3, and since an explanation thereof is the same as the explanation related to FIG. 4, the repeated explanation will not be provided here.

According to at least one example embodiment, in the horizontal cross section of the substrate layer 110, four ground TSVs 118*a* may be disposed in a region R3 between the first signal TSV 116*a* and the second signal TSV 116*b*. In particular, four ground TSVs 118*a* may be disposed to be arranged in the horizontal direction. Of course, the scope of the example embodiments of the present inventive concepts is not limited thereto, and for example, the region R3 may include four or more ground TSVs 118*a*. This makes it possible to more effectively mitigate a crosstalk noise that may occur between the first signal TSV 116*a* and the second signal TSV 116*b*.

Figure 7:
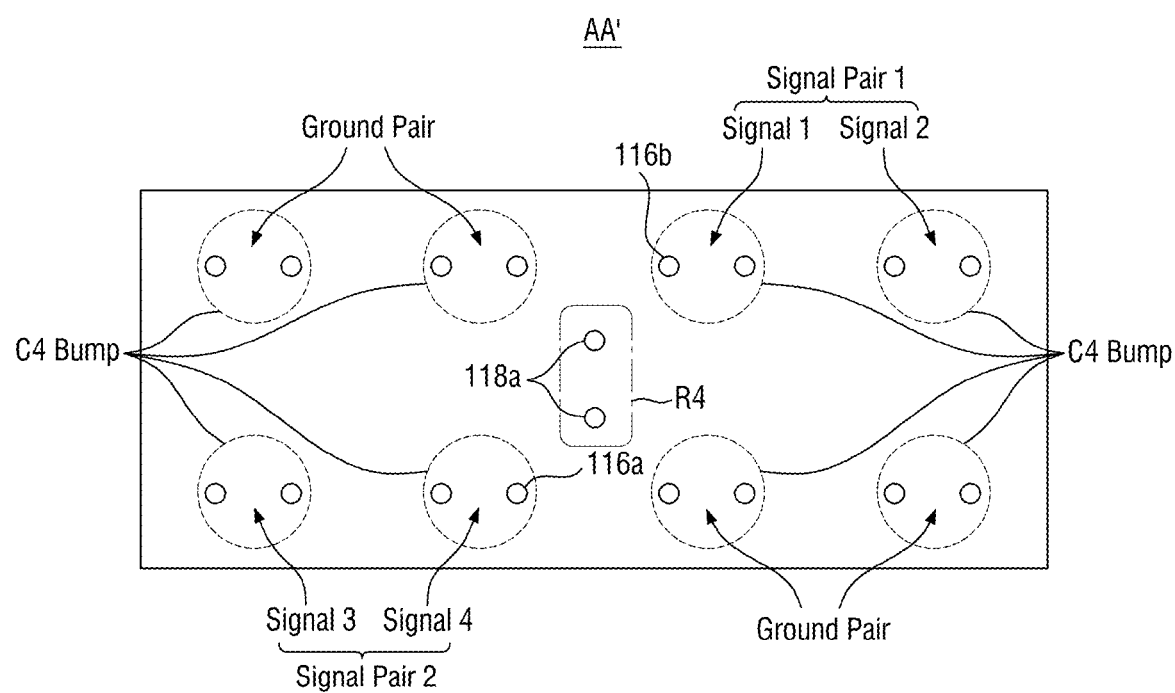

Subsequently, referring to FIG. 7, in at least one example embodiment, a total of sixteen TSVs are illustrated along with two ground TSVs 118*a* formed in a region R4, and since the explanation thereof is the same as the explanation related to FIG. 4, the repeated explanation will not be provided here.

According to at least one example embodiment, in the horizontal cross section of the substrate layer 110, two ground TSVs 118*a* may be disposed in the region R4 between the first signal TSV 116*a* and the second signal TSV 116*b*, but are not limited thereto. In particular, the two ground TSVs 118*a* may be disposed to be arranged in the vertical direction. This makes it possible to more effectively mitigate a crosstalk noise that may occur between the first signal TSV 116*a* and the second signal TSV 116*b*.

Figure 8:
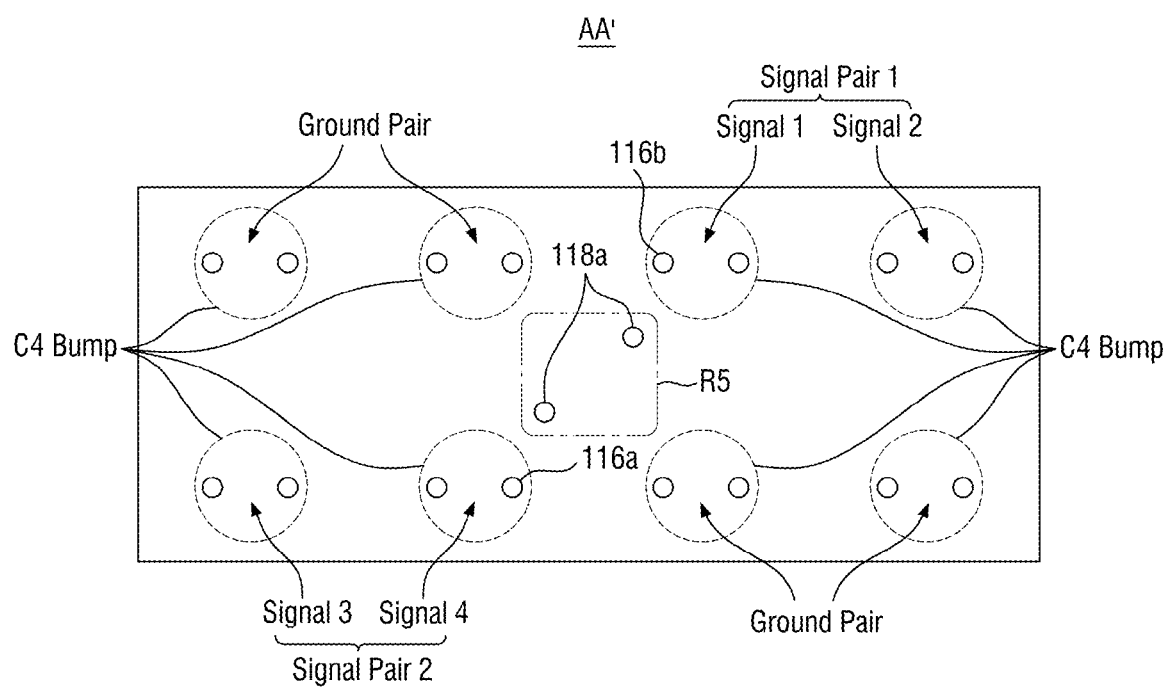

Subsequently, referring to FIG. 8, in at least one example embodiment, a total of sixteen TSVs are illustrated along with two ground TSVs 118*a* formed in a region R5, and since the explanation thereof is the same as the explanation related to FIG. 4, the repeated explanation will not be provided here.

According to at least one example embodiment, in the horizontal cross section of the substrate layer 110, two ground TSVs 118*a* may be disposed in the region R5 between the first signal TSV 116*a* and the second signal TSV 116*b*. In particular, the two ground TSVs 118*a* may be disposed to be arranged in an oblique direction. This makes it possible to more effectively mitigate a crosstalk noise that may occur between the first signal TSV 116*a* and the second signal TSV 116*b*.

Hereinafter, various modified examples for the ground TSV described in FIG. 3 will be described.

FIGS. 9 to 12 are diagrams for describing an interposer according to various example embodiments of the present inventive concepts.

Figure 9:
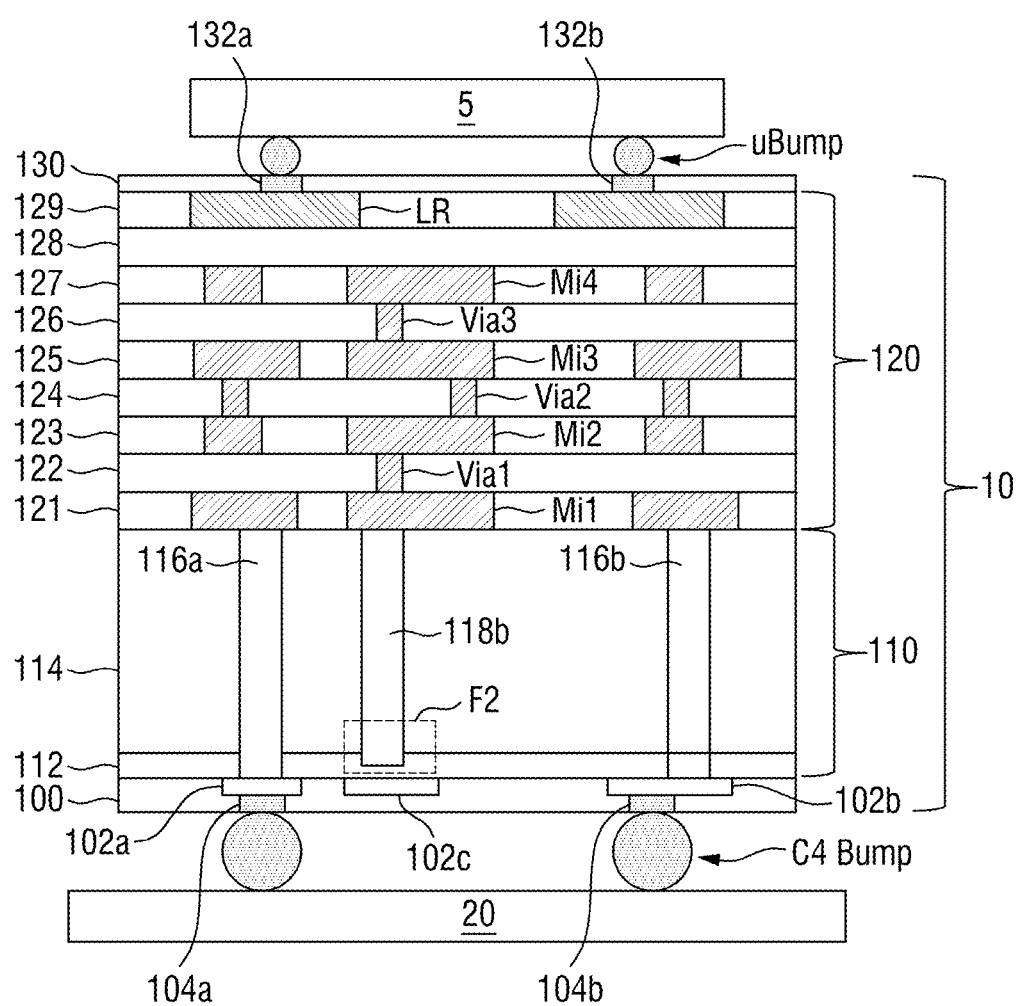
FIGS. 9 to 12 are diagrams for explaining the interposer according to some example embodiments of the present inventive concepts.

Referring to FIG. 9, an interposer 10 according to another example embodiment of the present inventive concepts may include a first passivation layer 100, a substrate layer 110, a BEOL layer 120, and a third passivation layer 130, etc., but is not limited thereto. Since most of the explanation thereof is the same as the explanation related to FIG. 3, the repeated explanation will not be provided and the ground TSV will be explained.

In at least one example embodiment, although a configuration in which the ground TSV 118*b* is disposed between the first signal TSV 116*a* and the second signal TSV 116*b*, and the ground TSV 118*b* is formed so that one end thereof is connected to the BEOL layer 120 and the other end of the ground TSV 118*b* floats is the same as the ground TSV 118*a* according to the at least one example embodiment of FIG. 3, the present example embodiment differs in that the other end (e.g., the second end) of the ground TSV 118b does not form an electrical connection with the third back metal 102c.

That is, a first end of the ground TSV 118b forms an electrical connection with the first metal Mi1 included in the plurality of metal layers 121 to 129 of the BEOL layer 120, but the second end of the TSV 118b does not form an electrical connection with the third back metal 102c.

In the present example embodiment, a floating region F2 indicated by the broken lines in FIG. 9 includes the other end (e.g., second end) of the ground TSV 118b. That is, the floating region F2 indicates that the ground TSV 118b floats, in other words, the ground TSV 118b may be electrically open. Also, in other words, the ground TSV 118b is not connected to a C4 Bump, such as the first bump C4 Bump, etc.

In other words, the ground TSV 118b may be formed to extend from the BEOL layer 120 to the second passivation layer 112. Also, the ground TSV 118b may have an arrangement in the horizontal cross section of FIGS. 4 to 8, but is not limited thereto.

The ground TSV 118b thus formed may mitigate a crosstalk noise between the first signal TSV 116a and the second signal TSV 116b.

Figure 10:
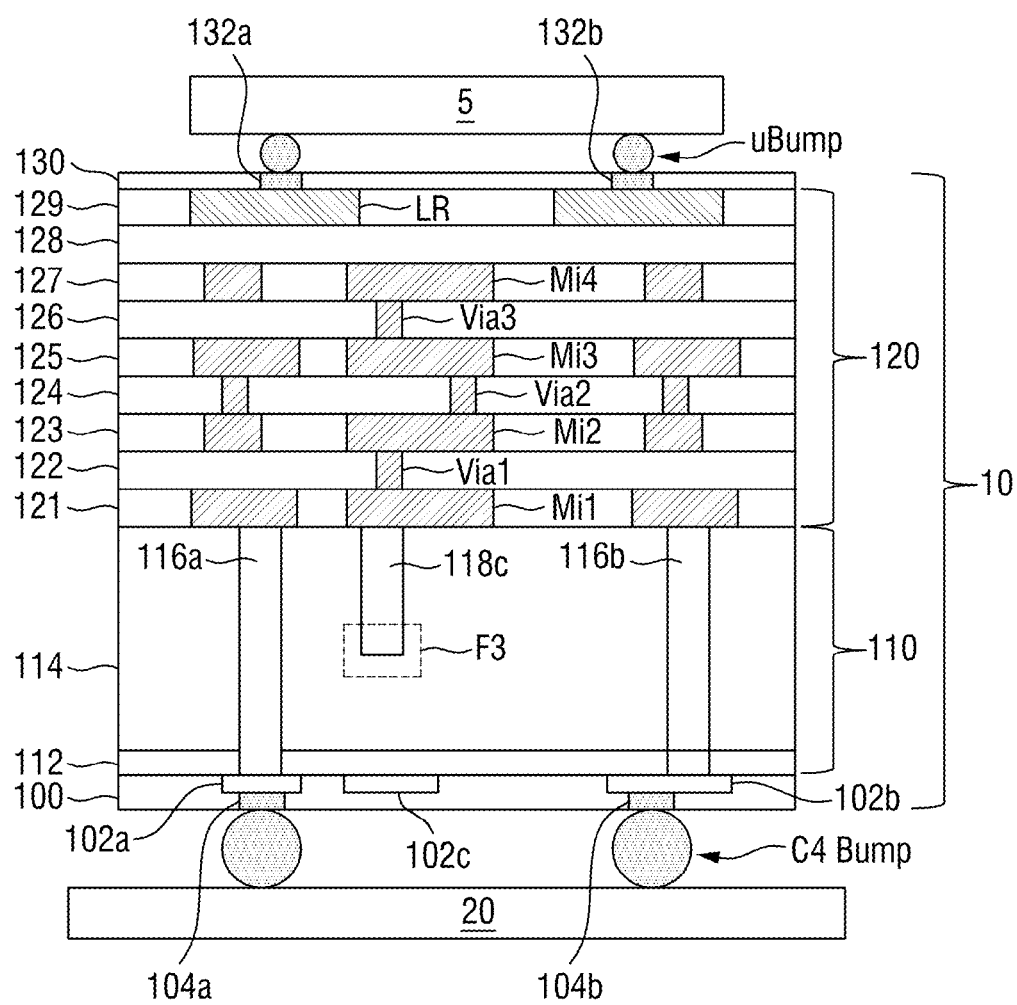

Referring to FIG. 10, an interposer 10 according to still another example embodiment of the present inventive concepts may include a first passivation layer 100, a substrate layer 110, a BEOL layer 120, and a third passivation layer 130, etc., but is not limited thereto. Since most of the explanation thereof is the same as the explanation related to FIG. 3, the repeated explanation will not be provided and the ground TSV will be explained.

In at least one example embodiment, a configuration in which the ground TSV 118c is disposed between the first signal TSV 116a and the second signal TSV 116b and is formed so that one end (e.g., a first end) of the ground TSV 118c is connected to the BEOL layer 120, and the other end (e.g., a second end) of the ground TSV 118c floats is the same as the ground TSV 118a according to the at least one example embodiment of FIG. 3, and a configuration in which the other end (e.g., second end) of the ground TSV 118c does not form an electrical connection with the third back metal 102c is the same as the ground TSV 118b according to the at least one example embodiment of FIG. 9.

That is, one end of the ground TSV 118c forms an electrical connection with a first metal Mi1 included in the plurality of metal layers 121 to 129 of the BEOL layer 120, but the other end of the TSV 118c does not form an electrical connection with the third back metal 102c.

In the present example embodiment, a floating region F3 indicated by the dotted lines in FIG. 10 includes the other end of the ground TSV 118c. That is, the floating region F3 indicates that the ground TSV 118c floats, in other words, the ground TSV 118c may be electrically opened. Also, in other words, the ground TSV 118c is not connected to a C4 bump, such as the first bump C4 Bump, etc.

However, in the present example embodiment, the ground TSV 118c may be formed not to extend from the BEOL layer 120 to the second passivation layer 112 but extend only to the silicon layer 114. Also, the ground TSV 118c may have an arrangement in the horizontal cross section of FIGS. 4 to 8, but is not limited thereto.

Even though the ground TSV 118c extends only to the silicon layer 114, and not the second passivation layer 112, since a vertical length of the interposer 10 is much greater than an interval (e.g., distance) between the lower surface of the interposer 10 and the package substrate 20, the ground TSV 118c thus formed may also mitigate a crosstalk noise between the first signal TSV 116a and the second signal TSV 116b, etc.

Figure 11:
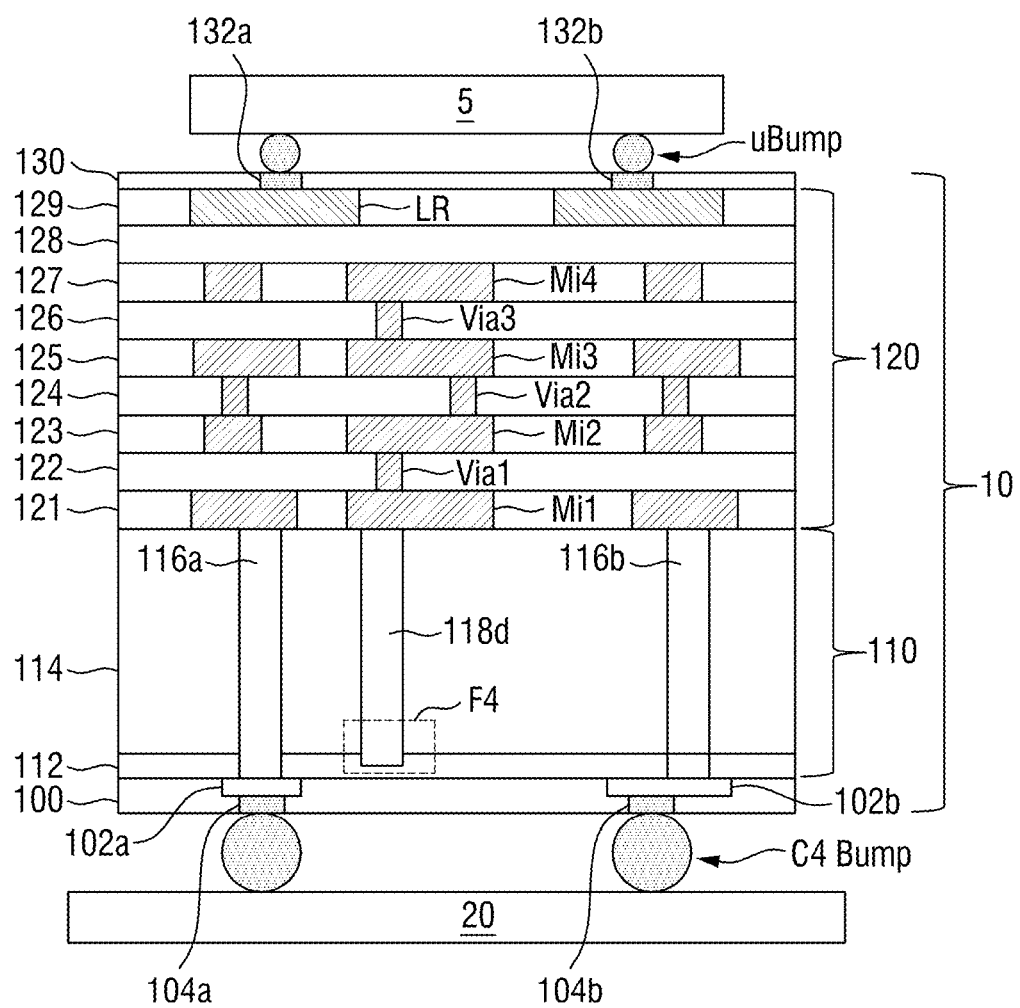

Referring to FIG. 11, the interposer 10 according to still another example embodiment of the present inventive concepts is substantially identical to the at least one example embodiment of FIG. 9 except that the back metal is not formed in the first passivation layer 110 which overlaps the lower part of the ground TSV 118d, or in other words, the first passivation layer 110 does not include a back metal which physically connects to the lower part of the ground TSV 118d.

In at least one example embodiment, a floating region F4 indicated by the dotted lines in FIG. 11 includes the other end (e.g., second end) of the ground TSV 118d. That is, the floating region F4 indicates that the ground TSV 118d floats, in other words, the ground TSV 118d may be electrically opened. Also, in other words, the ground TSV 118d is not connected to a C4 bump, such as the first bump C4 Bump, etc.

Figure 12:
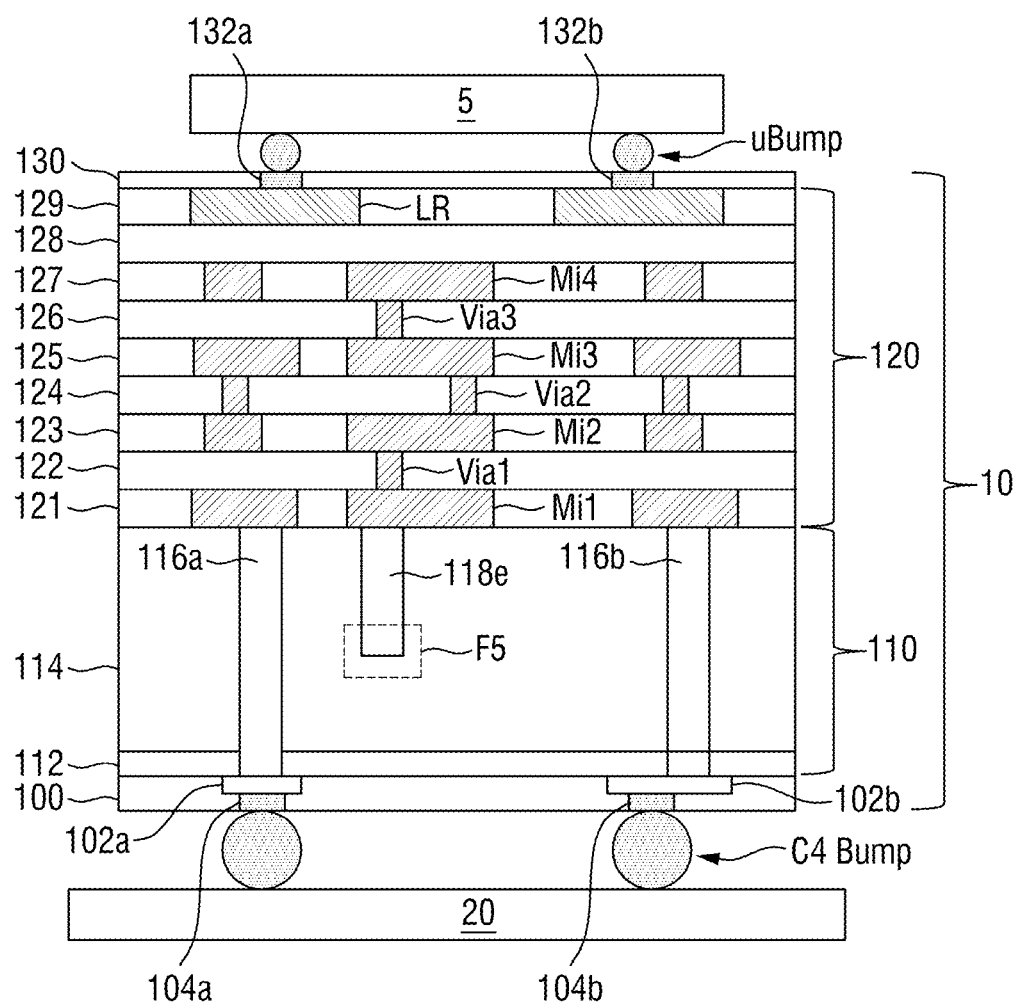

Referring to FIG. 12, the interposer 10 according to still another example embodiment of the present inventive concepts is substantially the same as the at least one example embodiment of FIG. 10, and different from the at least one example embodiment of FIG. 1, except that a back metal is not formed on the first passivation layer 110 which overlaps the lower part of the ground TSV 118e.

In at least one example embodiment, a floating region F5 indicated by the dotted lines in FIG. 12 includes the other end (e.g., second end) of the ground TSV 118e. That is, the floating region F5 indicates that the ground TSV 118e floats, in other words, the ground TSV 118e may be electrically opened. Also, in other words, the ground TSV 118e is not connected to a C4 bump, such as the first bump C4 Bump.

By forming the ground TSV according to the various example embodiments of the inventive concepts between the aggressor signal TSV (e.g., a first signal TSV) causing a crosstalk noise and the victim signal TSV (e.g., a second signal TSV) affected by the crosstalk noise, it is possible to effectively mitigate and/or decrease the crosstalk noise only with less cost and simpler manufacturing process than other, conventional attempts at decreasing the crosstalk noise.

Those skilled in the art will appreciate that many variations and modifications may be made to the example embodiments without substantially departing from the principles of the present inventive concepts. Therefore, the disclosed example embodiments of the inventive concepts are used in a generic and descriptive sense only and not for purposes of limitation.

The example embodiments of the present inventive concepts have been described with reference to the attached drawings, but it may be understood by one of ordinary skill in the art that the present inventive concepts may be performed one of ordinary skill in the art in other specific forms without changing the technical concept or essential features of the present inventive concepts. Further, the above-described example embodiments are merely examples and do not limit the scope of the rights of the present inventive concepts.

What is claimed is:
1. A semiconductor package comprising:
   a first passivation layer including a first lower pad and a second lower pad, the first lower pad and the second lower pad forming an electrical connection with one or more first bumps, the first passivation layer including a first back metal and a second back metal;

a substrate layer including a second passivation layer and a silicon layer, the substrate layer formed on the first passivation layer;

a back-end-of-line (BEOL) layer including a plurality of metal layers, the BEOL layer formed on the substrate layer; and a third passivation layer formed on the BEOL layer, the third passivation layer including a first upper pad and a second upper pad, the first upper pad and the second upper pad forming an electrical connection with one or more second bumps, and the substrate layer further including, a first signal TSV (Through Silicon Via) configured to transmit a first signal between the BEOL layer and the first lower pad through the first back metal, a second signal TSV configured to transmit a second signal between the BEOL layer and the second lower pad through the second back metal, and a ground TSV disposed between the first signal TSV and the second signal TSV, the ground TSV including a first end of the ground TSV connected to the BEOL layer, and a second end of the ground TSV configured to float the one or more first bumps are not physically connected to the ground TSV.

2. The semiconductor package of claim 1, wherein the first passivation layer further includes a third back metal physically connected to the ground TSV; and the third back metal does not form an electrical connection with the one or more first bumps.

3. The semiconductor package of claim 2, wherein the second end of the ground TSV forms an electrical connection with the third back metal.

4. The semiconductor package of claim 2, wherein the ground TSV is formed to extend from the BEOL layer to an upper surface of the third back metal.

5. The semiconductor package of claim 2, wherein the second end of the ground TSV does not form an electrical connection with the third back metal.

6. The semiconductor package of claim 2, wherein the ground TSV is formed to extend from the BEOL layer to the second passivation layer.

7. The semiconductor package of claim 2, wherein the ground TSV is formed to extend from the BEOL layer to the silicon layer.

8. The semiconductor package of claim 1, wherein the first passivation layer does not include a back metal which overlaps a lower part of the ground TSV.

9. The semiconductor package of claim 1, wherein the plurality of metal layers includes a first metal; and the first end of the ground TSV forms an electrical connection with the first metal.

10. A semiconductor package comprising:

a first passivation layer including a first lower pad and a second lower pad, the first passivation layer forming an electrical connection with one or more first bumps;

a substrate layer formed on the first passivation layer;

a back-end-of-line (BEOL) layer formed on the substrate layer; and the substrate layer includes, a first signal TSV (Through Silicon Via) configured to transmit a first signal between the first lower pad and the BEOL layer, a second signal TSV configured to transmit a second signal between the second lower pad and the BEOL layer, and at least one ground TSV, the at least one ground TSV not physically connected to the first bump the at least one ground TSV includes two ground TSVs, and in a horizontal cross section of the substrate layer, the two ground TSVs are disposed between the first signal TSV and the second signal TSV, and the two ground TSVs are arranged in a horizontal direction.

11. The semiconductor package of claim 10, wherein the at least one ground TSV includes a first end which is connected to the BEOL layer, and a second end which is configured to float.

12. The semiconductor package of claim 10, wherein the at least one ground TSV is disposed between the first signal TSV and the second signal TSV in a horizontal cross section of the substrate layer.

13. The semiconductor package of claim 10, wherein the at least one ground TSV includes four or more ground TSVs; and in a horizontal cross section of the substrate layer, the four or more ground TSVs are disposed between the first signal TSV and the second signal TSV, and the four or more ground TSVs are arranged in the horizontal direction.

14. The semiconductor package of claim 10, wherein the at least one ground TSV includes two ground TSVs; and in the horizontal cross section of the substrate layer, the two ground TSVs are disposed between the first signal TSV and the second signal TSV, and the two ground TSVs are arranged in a vertical direction.

15. The semiconductor package of claim 10, wherein the at least one ground TSV includes two ground TSVs; and in the horizontal cross section of the substrate layer, the two ground TSVs are disposed between the first signal TSV and the second signal TSV, and the two ground TSVs are arranged in an oblique direction.

16. A semiconductor package comprising:

a package substrate;

an interposer bonded on the package substrate through one or more first bumps, the interposer including, a first passivation layer, the first passivation layer including a first lower pad and a second lower pad, the first lower pad and the second lower pad forming an electrical connection with the one or more first bumps, the first passivation layer including a first back metal and a second back metal, a back-end-of-line (BEOL) layer including a plurality of metal layers, the BEOL layer formed on a substrate layer, the substrate layer including, a second passivation layer and a silicon layer, the substrate layer formed on the first passivation layer, a first signal TSV (Through Silicon Via) configured to transmit a first signal between the BEOL layer and the first lower pad through the first back metal, a second signal TSV configured to transmit a second signal between the BEOL layer and the second lower pad through the second back metal, and a ground TSV disposed between the first signal TSV and the second signal TSV, the ground TSV including a first end and a second end, the first end connected to the BEOL layer, and the second end configured to float, and a third passivation layer formed on the BEOL layer, the third passivation layer including a first upper pad and a second upper pad, the third passivation layer forming an electrical connection with one or more second bumps; and a first semiconductor chip bonded on the interposer through the one or more second bumps.

17. The semiconductor package of claim 16, further comprising:
   a second semiconductor chip disposed in parallel with the interposer, the second semiconductor chip bonded on the package substrate,
   wherein the interposer is configured to transfer a signal to the second semiconductor chip from the first semiconductor chip, or
   transfer a signal to the first semiconductor chip from the second semiconductor chip.

18. The semiconductor package of claim 16, further comprising:
   a printed circuit board bonded to a lower part of the package substrate through a ball grid array (BGA); and
   a third semiconductor chip disposed in parallel with the package substrate and bonded on the printed circuit board,
   wherein the interposer is configured to transfer a signal to the third semiconductor chip from the first semiconductor chip, or
   transfer a signal to the first semiconductor chip from the third semiconductor chip.

* * * * *